United States Patent [19]

Sakamoto et al.

[11] Patent Number: 4,875,862
[45] Date of Patent: Oct. 24, 1989

[54] SURFACE MOUNTABLE CONNECTOR

[75] Inventors: Yukio Sakamoto; Takeshi Tanabe; Iwao Fukutani; Toshio Hori, all of Nagaokakyo, Japan

[73] Assignee: Murata Manufacturing Co., Ltd., Kyoto, Japan

[21] Appl. No.: 287,085

[22] Filed: Dec. 21, 1988

Related U.S. Application Data

[63] Continuation-in-part of Ser. No. 242,417, Sep. 9, 1988, abandoned.

[30] Foreign Application Priority Data

Sep. 9, 1987 [JP] Japan .................................. 62-137971
Dec. 21, 1987 [JP] Japan .................................. 62-194182
Dec. 21, 1987 [JP] Japan .................................. 62-194183

[51] Int. Cl.[4] .............................................. H01B 9/09
[52] U.S. Cl. ........................................ 439/79; 439/83; 439/86
[58] Field of Search ............................ 439/76, 79–86, 439/87, 636

[56] References Cited

U.S. PATENT DOCUMENTS 4,722,691 2/1988 Gladd et al. .......................... 439/79

Primary Examiner—P. Austin Bradley
Attorney, Agent, or Firm—Wenderoth, Lind & Ponack

[57] ABSTRACT

A surface mountable connector to be mounted on a printed substrate has a plurality of connector pins projecting from the rear surface to be connected with wiring patterns on the printed substrate through a connector pin holder. The connector pin holder has a plurality of through holes at a pitch equal to that of the connector pins and a plurality of conductive patterns on the outside thereof corresponding to the through holes. The connector pins are inserted into the through holes in the connector holder and electrically connected to the conductive patterns corresponding to the through holes respectively, and the connector pin holder is placed on the wiring patterns on the printed substrate with the conductive patterns on the outer surface connected to the wiring patterns on the surface of the printed substrate by soldering, thereby electrically connecting the tip of each connector pin to a corresponding wiring pattern on the surface of the printed substrate.

10 Claims, 5 Drawing Sheets

SURFACE MOUNTABLE CONNECTOR

This application is a continuation-in-part of application Ser. No. 07/242,417, filed Sept. 9, 1988 now abandoned.

FIELD OF THE INVENTION

The present invention relates to a surface mountable connector, and more particularly to a surface mountable connector which electrically connects right-angle type connector pins at a connector housing positioned on the surface of a printed substrate with wiring patterns on the surface thereof.

BACKGROUND OF THE INVENTION

Referrng to FIGS. 16(a) through 16(c), the conventional surface mountable connector is shown, in which a male or a female type connector 12 mounted on the surface of a printed substrate 11 comprises a connector housing 13 having surface connector sockets and connector pins 14a and 14b which project from the rear surface 13b of the connector housing 13, are bent at right angles toward the surface of printed substrate 11, and fixedly connected by soldering at the tips with wiring patterns (not shown) on the surface of printed substrate 11.

The pins 14a and 14b project at two vertical stages from the rear surface of the connector housing 13. In the drawing, only one connector pin is shown at each of the vertical stages, but a plurality of pins are arranged at each stage along the surface of printed substrate 11.

Since such connector 12 is of the surface mountable type, it is impossible to insert and fix the tips of connector pins 14a and 14b through through holes provided in the printed substrate 11. Therefore, for example, as shown in FIGS. 16(a) to 16(c), the tips of both connector pins 14a and 14b are bent outwardly or inwardly so as to be connected by soldering to the wiring patterns on the printed substrate.

Therefore, the conventional connector 12 requires a bending step for the tips of connector pins 14a and 14b, but unless the amount of bending or the bending angle is regulated with accuracy, the pitch between the connector pins 14a and 14b becomes incorrect so that the connector pins cannot be connected to the wiring patterns (not shown) accurately and reliably. Hence, the bending takes a fair amount of time and labor and the cost becomes very high.

Accordingly, the conventional connector has the defect that the mounting on the surface of the printed substrate must be carefully carried out.

OBJECTS OF THE INVENTION

A first object of the invention is to provide a surface mountable connector which need not have the tips of the connector pins thereof bent so that the manufacturing cost can be reduced by an amount corresponding to the cost of bending the tips.

A second object of the invention is to provide a surface mountable connector with which there is no fear that the pitch between the tips of the connector pins will be incorrect, and which can be reliably and accurately mounted on the surface of the printed substrate.

These and other objects of the invention will become more apparent from the detailed description and examples which follow.

BRIEF DESCRIPTION OF THE DRAWINGS

In FIGS. 1 to 15 parts, which correspond to the parts in the conventional device shown in FIGS. 16(a), 16(b) and 16(c), have the same reference numerals as in the conventional device.

DETAILED DESCRIPTION OF THE INVENTION

Figure 1:
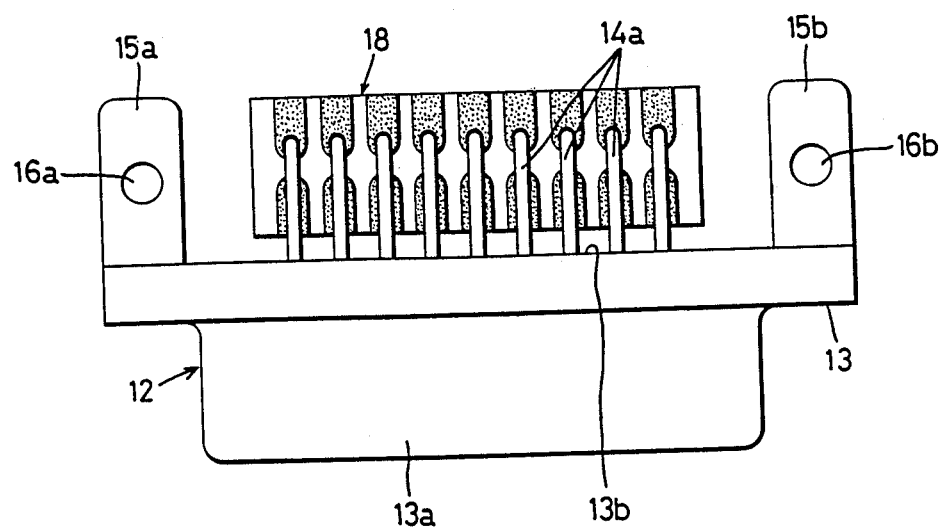
FIG. 1 is a plan view of a first embodiment of a surface mountable connector according to the invention.
Figure 2:
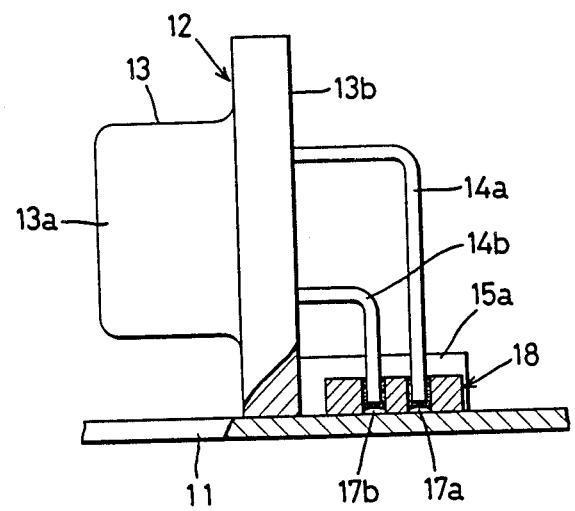
FIG. 2 is a partially sectional side view thereof.
Figure 3:
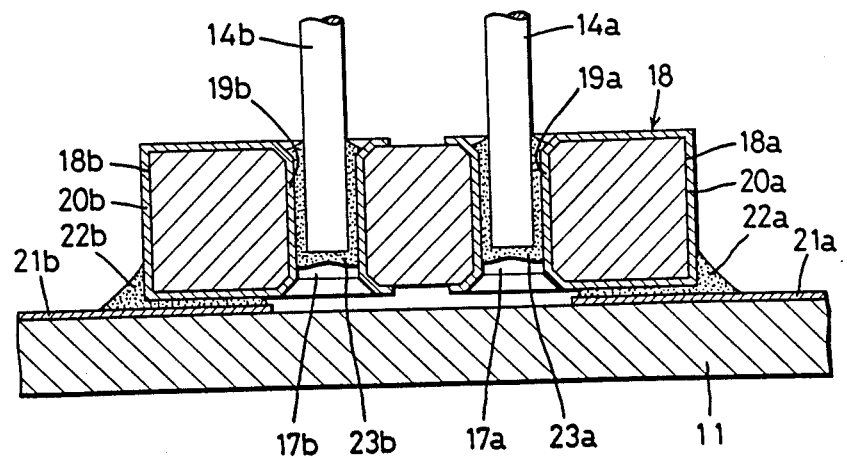
FIG. 3 is an enlarged sectional view of the principal portion of the part shown in section in FIG. 2.
Figure 4:
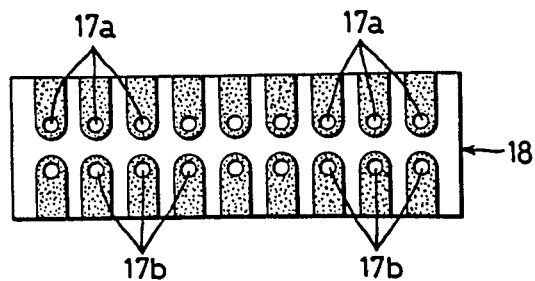
FIG. 4 is a plan view of a first form of a connector pin holder.
Figure 5:
FIG. 5 is a side view thereof.

In FIGS. 1–7 of the drawings, a connector 12 mounted on a printed substrate comprises a connector housing 13 having a connector plug 13a on the front surface and upper and lower lines of a plurality of connector pins 14a and 14b projecting from the rear surface 13b of the connector housing, with nine connector pins in each line.

The connector housing 13 is provided at both ends at the lower portion with mounting angles 15a and 15b respectively, and is adapted to be mounted on the printed substrate 11 by threaded bolts inserted into threaded bores 16a and 16b formed in the angles 15a and 15b.

The connector 12 of the invention is provided with a pin holder 18 provided with through holes 17a and 17b coincident with pitch of the ends of the respective connector pins 14a and 14b and equal in number to the number of connector pins 14a and 14b.

As shown in FIGS. 1–5, the first example of the connector pin holder 18 is formed of inslating material such as glass, epoxy resin, heat-resistant plastic, alumina or ferrite.

Conductive patterns 19a and 19b are formed on the inner peripheral surfaces of the through holes 17a and 17b of the connector pin holder 18.

On one outside surface 18a of the connector pin holder 18 are formed conductive patterns 20a corresponding to the one conductive patterns 19a and connected thereto.

On the other outside surface 18b of the connector holder 18 are formed conductive patterns 20b corresponding to the other conductive patterns 19b and connected thereto.

In the connector pin holder 18, the tips of the corresponding connector pins 14a and 14b are inserted into the through holes 17a and 17b and the through holes 17a and 17b are filled with solder 23a and 23b, the tips of connector pins 14a and 14b thereby being conductively connected with the conductive patterns 19a and 19b.

At this time, the bottom surface of connector housing 13 and that of connector pin holder 18 are adapted to be positioned in the same plane.

In the connector 12 constructed as above-described, the connector housing 13 is mounted on the printed substrate 11 by the mounting angles 15a and 15b, the connector pin holder 18 is placed across the wiring patterns 21a and 21b on the printed substrate 11, and thereafter the conductive patterns 20a on one outside surface and the one wiring patterns 21a on the printed substrate 11 are soldered by solder 22a and the conductive patterns 20b on the other outside surface 18b and the other wiring patterns 21b are soldered by solder 22b, whereby the tips of connector pins 14a and 14b are electrically connected to the wiring patterns 21a and 21b on the printed substrate 11 through the conductive patterns 19a and 19b on the inner surfaces of the through holes 17a and 17b, the conductive patterns 20a and 20b on the outer surface, and the solder 22a and 22b.

Figure 6:
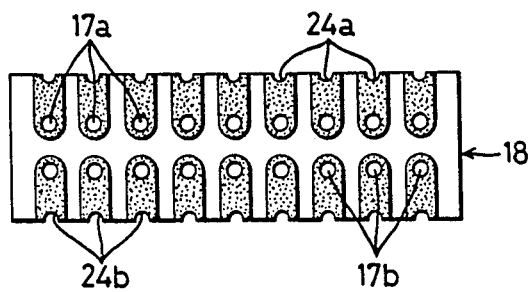
FIG. 6 is a plan view showing a second form of the connector pin holder.

A second example of the connector pin holder 18, shown in FIG. 6, has on the outside surface cutouts 24a and 24b in addition to the through holes 17a and 17b.

Since the connector pin holder is provided with the cutouts 24a and 24b, solder 22a and 22b deposited on the outside surface contacts a larger surface area, whereby an increase in mounting strength of the connector pin holder 18 with respect to the printed substrate is obtained.

The cutouts 24a and 24b may be formed when a mother substrate, in which a large number of through holes 17a and 17b are formed, is cut at a cut line parallel to the through holes 17a and 17b to thereby form the connector pin holder 18.

Figure 7:
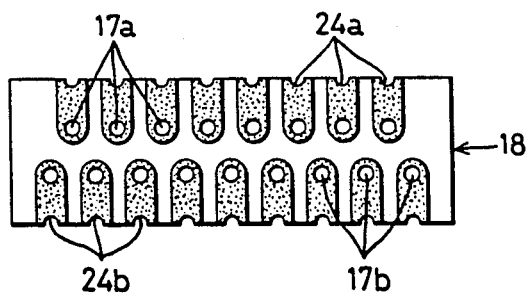
FIG. 7 is a plan view of a third form of the connector pin holder.
Figure 8:
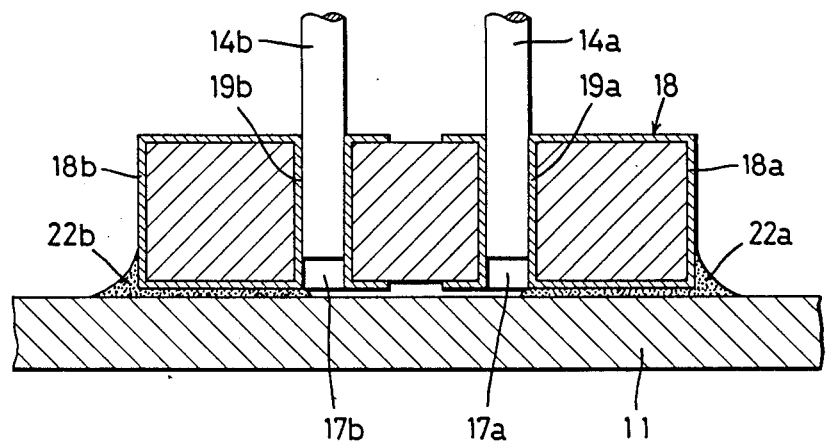
FIG. 8 is an enlarged sectional view similar to FIG. 3 showing a still further modified form of a connector pin holder in the mounted condition.

A third example of the connector pin holder 18, as shown in FIG. 7, has through holes 17a and 17b and cutouts 24a and 24b offset transversely to the holder.

This connector pin holder, the same as that in FIG. 6, is designed to increase the mounting strength thereof with respect to the printed substrate 11.

In addition, the configuration of the conductive pattern formed on the connector pin holder 18 can be changed. Also, the conductive patterns 19a and 19b on the inner surfaces of through holes 17a and 17b of the connector pin holder 18 are not indispensable, and instead the connector pin may be connected directly to conductive patterns 20a and 20b at the outer surface. Furthermore, in the aforesaid embodiment, the connector pins 14a and 14b project in two vertically spaced lines from the rear surface of the connector housing 13, which is not indispensable.

The fourth example of the connector pin holder 18 is shown in FIG. 8 to FIG. 11(a) to 11(c) and is used by pressing the connector pins 14a and 14b into the through holes 17a and 17b.

Figure 10A:
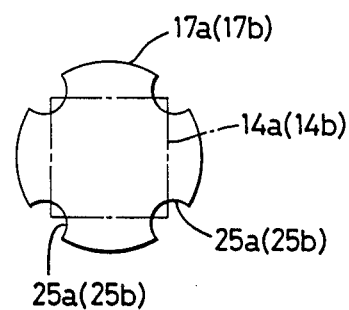
FIGS. 10(a) and 10(b) are schematic plan views showing different shapes of through holes in the connector pin holder.
Figure 10B:
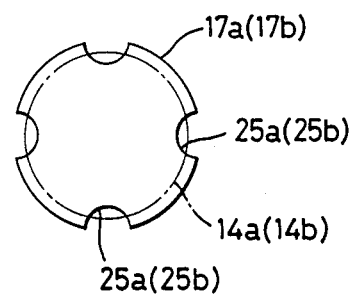

In order to make it possible to press the connector pins 14a and 14b into the through holes 17a and 17b, the through holes 17a and 17b are provided with a plurality of projections 25a and 25b formed on an inner circumferential surface thereof, as shown in FIG. 10(a), when the connector pins 14a and 14b have a square cross-section, and, as shown in FIG. 10(b) when they have a circular cross-section.

When the connector pins 14a and 14b are inserted into the through holes 17a and 17b, the connector pins 14a and 14b are deformed by the projections 25a and 25b, whereby the connector pins 14a and 14b are fixed in the through holes 17a and 17b.

In this case, the number and positions of the projections 25a and 25b are suitably set, and electrically conductive patterns 19a and 19b are provided on the inner circumferential surface of the through holes 17a and 17b.

Figure 9:
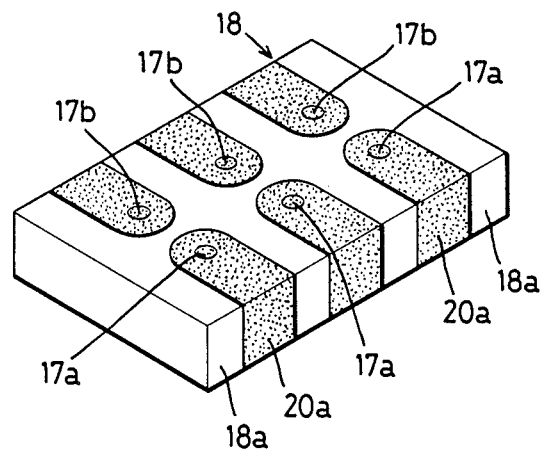
FIG. 9 is a perspective view of the connector pin holder of FIG. 8.

In addition, for easy understanding, the number of the respective through holes 17a and 17b has been shown as three in FIG. 9.

Figure 11A:
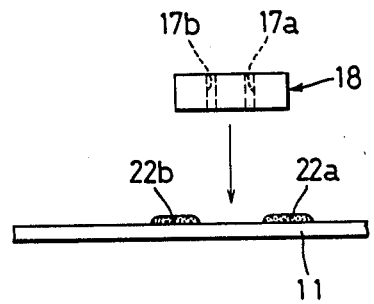
FIGS. 11(a), 11(b) and 11(c) are elevation views showing the order of mounting the parts of connectors on printed substrates.
Figure 11B:
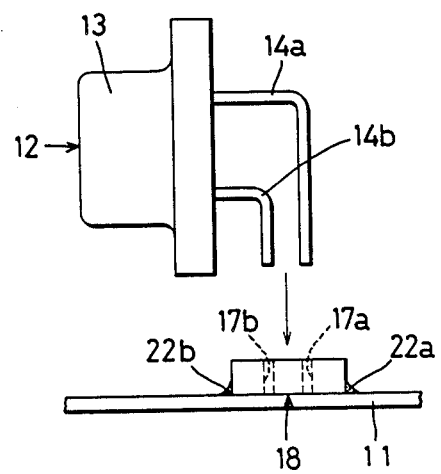

In order to mount the connector 12 on the printed substrate 11 by means of the connector pin holder 18, the solder 22a and 22b is applied to the printed substrate 11, as shown in FIG. 11(a), the connector pin holder 18 is placed on the solder 22a and 22b, and the solder 22a and 22b are caused to reflow to fixedly mount the connector pin holder 18 on the printed substrate 11, as shown in FIG. 11(b).

Figure 11C:
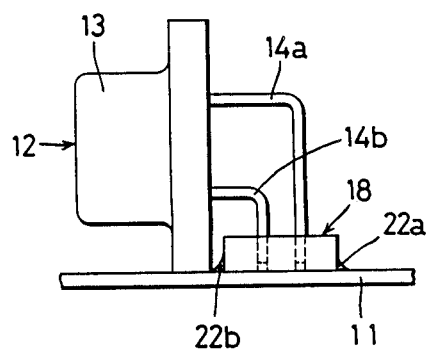

Next, the connector pins 14a and 14b of the connector 12 are pressed into the through holes 17a and 17b of the connector pin holder 18 to fixedly mount on the connector 12 on the printed substrate 11, as shown in FIG. 11(c).

The connector pin holder 18 according to this fourth example can be used to mount the connector 12 on the printed substrate 11 by merely pressing the connector pins 14a and 14b into the through holes 17a and 17b. Thus the mounting operation is simplified.

Figure 12:
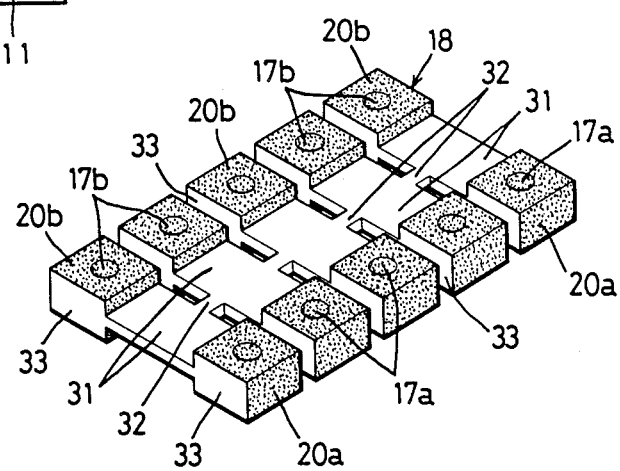
FIG. 12 is a perspective view of a fifth example of a connector pin holder.
Figure 13:
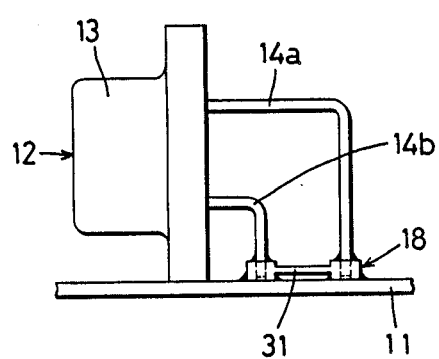
FIG. 13 is a side view showing the connector of FIG. 12 in the mounted condition.
Figure 14:
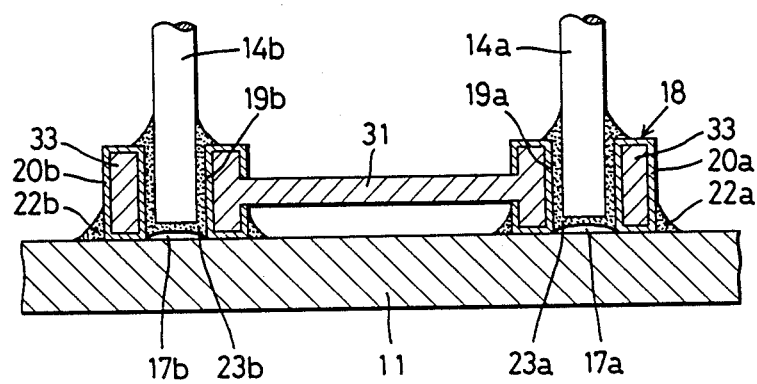
FIG. 14 is an enlarged sectional view showing the principal parts of the mounted connector holder of FIGS. 12 and 13.

The fifth example of the connector pin holder 18 shown in FIGS. 12-14 has a construction in which the portions of the connector pin holder 18 provided with the respective through holes 17a and 17b are substantially independent of each other and are connected to each other only by means of an elastic connecting piece so that they can accommodate bending and the like of the printed substrate.

The connector pin holder 18 is provided with a plurality of elastic connecting pieces 31 formed of a highly heat-resistant resin such as polyethylene terephthalate or polyphenylene sulfide.

These elastic connecting pieces 31 have a plate-like shape having a reduced wall thickness and are positioned side by side in one direction.

The respective elastic connecting pieces 31 are connected with each other by means of narrow elastic connectors 32. The respective elastic connecting pieces 31 each have fitting pieces 33 at the opposite ends, which are provided with the through holes 17a and 17b into which the connector pins 14a and 14b of the connector 12 are inserted. The fitting pieces have a thickness greater than the thickness of the elastic connecting pieces.

The respective fitting pieces 33 are provided with electrically conductive patterns 20a and 20b formed on the outer surfaces thereof. Also the through holes 17a and 17b are provided with electrically conductive patterns 19a or 19b on inner peripheral surfaces thereof.

The connector 12 is mounted on the printed substrate 11 by means of this embodiment of the connector pin holder 18 in the same manner as in the first example shown in FIGS. 1-5. The mounted condition of the connector 12 is shown in FIGS. 13 and 14.

In this case, the respective elastic connecting pieces 31, which are arranged side by side, are connected to each other by narrow elastic connectors 32, so that they can be moved independently of each other to a certain degree. Moreover, the fitting pieces 33 at the ends of the elastic connecting pieces 31 can also move relative to each other because of the elasticity of the connecting pieces 31, so that even though the fitting pieces 33 are moved by the bending and the like of the printed substrate 11, the elastic connecting pieces 31 connecting the fitting pieces 33 are bent resiliently regardless of the condition of the adjacent connecting piece 31. As a result, the fitting pieces 33 can be securely mounted on the printed substrate 11.

Figure 15:
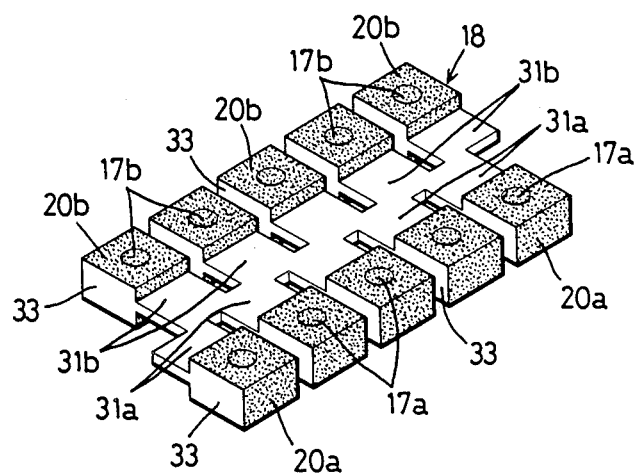
FIG. 15 is a perspective view showing a sixth example of a connector pin holder.
Figure 16A:
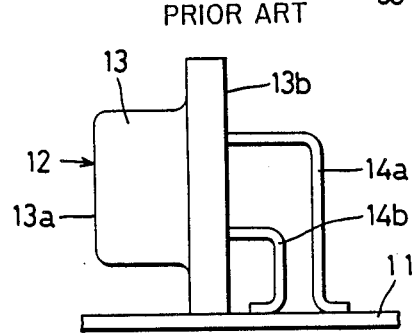
FIGS. 16(a)–16(c) are side views showing different examples of conventional surface mounted connectors.
Figure 16B:
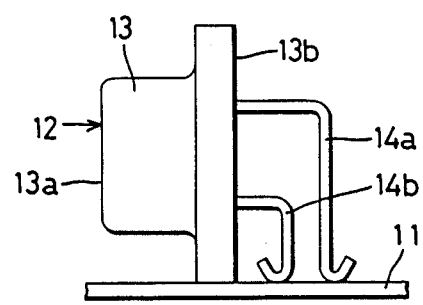
Figure 16C:
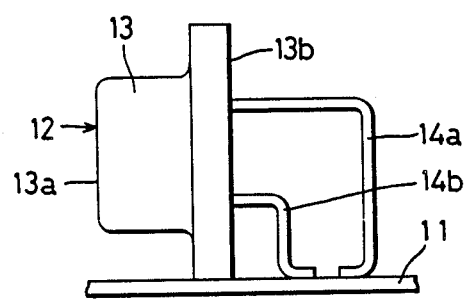

A sixth example of the connector pin holder shown in FIG. 15 is a modification of the fifth example. The connector pin holder 18 according to this sixth example has a construction in which the fitting pieces 33 are laterally offset, and the elastic connecting pieces 31 are constituted by portions 31a and 31b attached to the respective offset fitting pieces and joined at only part of their width at the middle thereof. An exposed end edge of each of the portions 31b is joined to a portion of an exposed end edge of a portion 31a of an adjacent connecting piece to join the connecting pieces 31 to each other. The operation and effects of this sixth example are the same as those in the above described fifth example, so that description thereof is omitted.

In addition, although fitting pieces are mounted on both end portions of the elastic connecting pieces in this preferred embodiment, a fitting piece may be mounted on only one end portion thereof.

Furthermore, the numbers of the elastic connecting pieces and the fitting pieces to be connected to each other are to correspond to the number of connector pins 14a and 14b and wiring patterns on the circuit board. Accordingly, said numbers are optionally selected.

The connector according to the present invention is mounted on the surface of the printed substrate by the connector pin holder, and the conductive pattern on the outer surface of the connector pin holder are soldered to the wiring pattern on the surface of the printed substrate, thereby electrically connecting the tips of the connector pins with the wiring patterns on the surface of the printed substrate. Hence, the connector pins are not required to be bent at the tips, which makes it possible to reduce the manufacturing cost. Moreover, there is no fear that the pitch between the respective tips of the connector pins becomes incorrect, and the connector can reliably and easily be mounted on the surface of a printed substrate.

While embodiments of the invention have been shown and described, the invention is not limited to the specific construction thereof, which is merely exemplary, the invention being defined in the appended claims.

We claim:

1. A surface mountable connector comprising:
    a connector housing;
    a plurality of connector pins projecting from the rear surface of said connector housing; and
    a connector pin holder having a plurality of through holes therein through which said connector pins are inserted on one face thereof, and being spaced the same as the pitch of said connector pins, and having on at least the outer surface thereof a plurality of conductive patterns corresponding to said through holes respectively and extending from said through 1:oles to the opposite face of said connector pin holder, the tips of said connector pins in said through holes being in electrical connection with the respective conductive patterns.

2. A surface mountable connector as claimed in claim 1 wherein said connector pin holder is formed of an electrically insulating material.

3. A surface mountable connector as claimed in claim 1 wherein said connector pin holder has cutouts in the outside surface thereof.

4. A surface mountable connector as claimed in claim 1 wherein the through holes in the connector pin holder each have an electrically conductive material on the inner peripheral surface thereof and connected to the corresponding conductive pattern, and the connector pins are soldered to the electrically conductive material.

5. A surface mountable connector as claimed in claim 1 in which the through holes of the connector pin holder have a shape for receiving the connector pins in a press fit, and said through holes each have an electrically conductive material on the inner peripheral surface thereof and connected to the corresponding conductive pattern.

6. A surface mountable connector as claimed in claim 5 in which the through holes of the connector pin holder each have a plurality of projections on the inner peripheral surface thereof for receiving the connector pins in a press fit therein.

7. A surface mountable connector as claimed in claim 1 in which the connector pin holder has a plurality of elastic connecting pieces having a plate-like shape arranged side by side in one direction, an elastic connection between said connecting pieces connecting them to each other, and a fitting piece on at least one end of each of said elastic connecting pieces and having a thickness greater than the thickness of the corresponding connecting piece and having a through hole into which a corresponding conector pin is inseted, and the respective fitting pieces having the electrically conductive pattern on the outer suface thereof.

8. A surface mountable connector as claimed in claim 7 in which said elastic connection comprises narrow elastic connectors.

9. A surface mountable connector as claimed in claim 7 in which each elastic connecting piece has a fitting piece at both ends thereof.

10. A surface mountable connector as claimed in claim 7 in which said elastic connecting pieces each have two portions which are laterally offset from each other and joined along only a part of the opposed end edges thereof, and said elastic connections each comprise an exposed portion of the end edge of one connecting piece portion being joined to an exposed portion of the end edge of the other portion of an adjacent connecting piece.

* * * * *